Feb. 6, 1968 R. E. WAYLAND ET AL 3,368,180

MOUNTING CAPSULE FOR ELECTRICAL COMPONENT

Filed April 15, 1965

Inventors:
Robert E. Wayland
George B. Lazarow
By: Hofgren, Wegner, Allen, Stellman & McCord
Attorneys United States Patent Office 3,368,180
Patented Feb. 6, 1968

3,368,180
MOUNTING CAPSULE FOR ELECTRICAL COMPONENT

Robert E. Wayland, Niles, and George B. Lazarow, Park Ridge, Ill., assignors to Warwick Electronics Inc., a corporation of Delaware Filed Apr. 15, 1965, Ser. No. 448,406
4 Claims. (Cl. 338—315)

ABSTRACT OF THE DISCLOSURE

An insulating capsule for mounting a resistor to the chassis of a wave signal receiver comprising two hollow telescopically related capsules having spring clips at opposite closed ends to mount a resistor between them, one of the capsules having a separate insulated lead wire channel for connecting a lead wire to a mounting clip and both capsules having stepped interiors to facilitate registration and assembly of the capsules and the resistor.

This invention relates to electrical components and more particularly to a novel assembly for jacketing or encapsulating a resistor and for mounting the same to the chassis of a wave signal receiver.

Recently, slim, extremely elongate resistors have been used in the circuitry of wave signal receivers such as television sets and the like. These resistors may have a capability of reducing voltages of 25,000 kv. at one end to 5,000 kv. at the other end. In use, these resistors frequently must pass through the metal chassis of the receiver. Formerly an enlarged opening in the chassis was formed so that the air between the resistor and the interior of the opening in the chassis would serve as an insulating medium. However, frequently these resistors must be used in portions of the receiver wherein the presence of air must be kept to a minimum.

Therefore, it is a general object of this invention to provide a new and improved resistor housing.

A primary object of this invention is to provide a new and improved means for mounting a resistor to the chassis of a wave signal receiver which permits the resistor to be mounted through the chassis without the need for an enlarged opening about the resistor.

Another object of this invention is to provide a new and improved resistor housing which has means formed on the exterior of the housing for easily and rapidly mounting the housing to the chassis of a wave signal receiver.

Still another object of this invention is to provide a new and improved resistor housing which may be easily assembled and disassembled for rapid manufacture and convenient servicing of the wave signal receiver.

Still another object of this invention is to provide a new and improved resistor housing which provides a means for suitably electrically connecting the resistor to lead wires which extend from the resistor to other electrical components, with means on the exterior of the housing for mounting the resistor to a chassis of a wave signal receiver and wherein the resistor is encapsulated in such a manner as to permit the resistor to extend through the chassis of the receiver without the necessity for an enlarged opening in the chassis spaced from the exterior of the housing.

Other objects, features and advantages of the present invention will be apparent from the following description of the preferred embodiments illustrated in the accompanying drawings, in which.

Figures 1, 3:
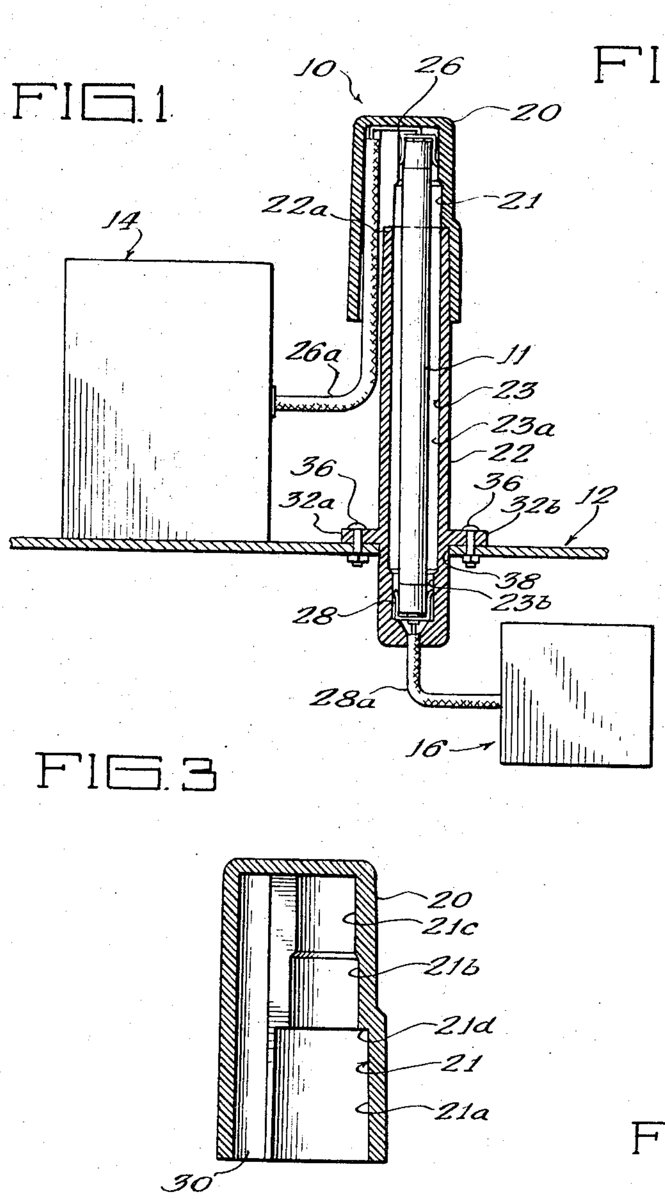
FIGURE 1 is a sectional view showing the resistor housing of this invention mounted to the chassis of a wave signal receiver.
FIGURE 3 is an enlarged sectional view of the top portion of the resistor housing of this invention.
Figure 2:
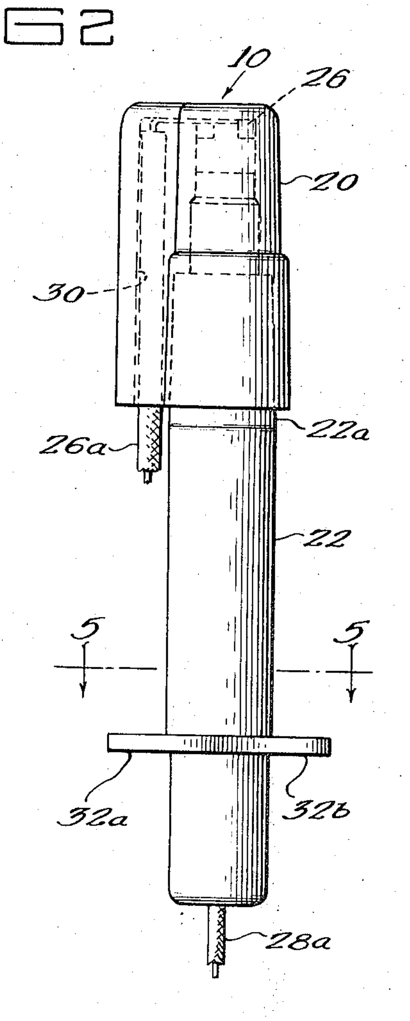
FIGURE 2 is an enlarged fragmentary side elevational view partially in phantom outline of the resistor housing of this invention.
Figure 4:
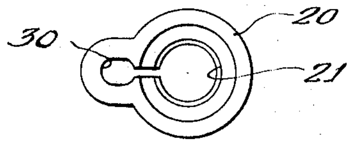
FIGURE 4 is a bottom plan view of the top portion of the resistor housing of this invention.
Figure 5:
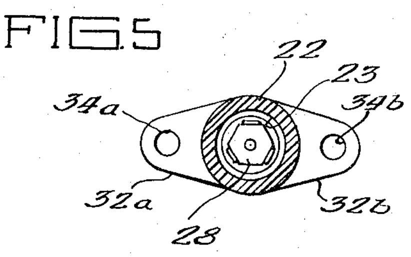
FIGURE 5 is a section view taken along the line 5—5 of FIGURE 2.

Referring now to the drawings, resistor housing 10 of this invention is intended for use mounting and insulating a resistor 11 in the chassis 12 of a wave signal receiver, such as a television set. A typical use for the resistor to be held in the housing may be in reducing the voltage between a high-voltage component 14 and a second component 16 such as a potentiometer.

The resistor housing is a two-part structure including a cap 20 having a hollow interior 21 and a bottom 22 also having a hollow interior 23. Preferably the housing parts 20 and 22 are molded of a suitable insulating material such as polyethylene or other equivalent materials. The interior 21 of the cap has a first enlarged diameter portion 21*a* of a size to snugly embrace the exterior of the open end of the bottom 22 to form an enclosed capsule. The interior 21 further has a reduced diameter portion 21*b* of a size to loosely embrace the resistor 11 to be held in the capsule, and a further reduced portion 21*c* for receiving resistor gripping means 26. The juncture of portions 21*a* and 21*b* forms a circumferential shoulder 21*d* which provides a positive stop means for limiting the axial telescopement of the cap and bottom so that the longitudinal extent of the inner cavity of the capsule will be coextensive with the length of the resistor to be held therein. The exterior of the open end portion 22*a* of the bottom member 22 is slightly inwardly tapered so that the bottom may be snugly telescopically received within the portion 21*a* of the cap member. The interior 23 of the bottom member is similarly provided with a portion 23*a* of a size to loosely embrace the resistor and a reduced diameter portion 23*b* for receiving resistor gripping means 28.

While the resistor 11 shown here is extremely slim and elongate, it is to be understood that the structure of the resistor housing of this invention may be easily adapted for use with resistors of different configurations. The resistor is held upright in the housing spaced from the inner walls of the hollow interior of the cap and bottom portions. For this purpose, the resistor is grasped at the top and bottom ends in electrical contact by resistor gripping means or the spring clips 26 and 28, respectively. Suitable lead wires such as 26*a* and 28*a* extend from the clips 26 and 28, respectively, for electrically connecting the resistor to the other components of the wave signal receiver.

For accommodating the lead wire 26*a*, the cap 20 of the resistor housing is provided with a sleeve portion 30 which holds the lead wire 26*a* substantially parallel to the resistor and snugly within the resistor housing for a substantial distance, thereby reducing the possibility of accidental disconnection of the lead wire 26*a*. Thus the structure of the resistor housing provides a means for mounting the resistor in the housing in spaced relationship to the inner walls of the capsule and the means which holds the resistor in the housing further serves as a means for electrically contacting the resistor and is directly connected to lead wires which extend outwardly from the opposite ends of the housing for connection to suitable components.

Some of the slim, elongate resistors 11 have a capacity of dropping the voltages from 25,000 kv. at the top of the resistor to 5,000 kv. at the bottom. Typically these resistors are used in a portion of the receiver which is enclosed from the remainder of the set and sometimes known as the "high voltage can." In this area of the receiver, little air is permitted for reasons of safety. Recent developments in wave signal receiver circuitry have made it desirable to mount the resistors so that they pass through the television chassis. Formerly, the most common form of insulating such resistors from the chassis was to provide an enlarged opening about the resistor. Since this created an air space about the resistor in an area of the set wherein such spaces were undesirable, this form of mounting was undesirable. However, the resistor housing of this invention is provided with a means for mounting the resistor so that it extends through an opening in the chassis without creating an air space between the interior of the chassis opening and outer walls of the mounting means. To this end, the resistor housing is provided with a pair of outwardly extending ears 32_a_ and 32_b_ formed on the bottom portion thereof. These ears 32_a_ and 32_b_ are provided with openings 34_a_ and 34_b_, respectively, for receiving suitable fastener means, such as the bolts 36 to secure the resistor housing to the chassis 12. The resistor receiving opening 38 which is formed in the chassis need be only coextensive in diameter with the outer diameter of the bottom portion 22 of the resistor housing since the resistor itself is sufficiently insulated within the housing.

The resistor housing of this invention provides a means for mounting a resistor to a television chassis so that the resistor may extend through the chassis and be adequately insulated therefrom. This invention is a significant improvement over previous means of mounting a resistor to a television chassis wherein either air was utilized as an insulating medium or an insulating jacket was molded on the resistor. With the resistor housing of this invention, the top part may be withdrawn from the bottom and the resistor may be easily removed from the housing for servicing or replacement. The housing itself may be simply molded from suitable plastic parts and the spring clips 26 and 28 may be held in the tops and bottoms of the resistor by notoriously old and well-known frictional clip means in the form of barbs or the like. The laterally projecting ears provide an extremely easy means for mounting the housing to the chassis and holding the resistor in the chassis in a highly satisfactory manner.

The foregoing detailed description has been given for clearness of understanding only, and no unnecessary limitations should be understood therefrom, as some modifications may be obvious to those skilled in the art.

We claim:

1. An insulating capsule for mounting an electrical element to the chassis of a wave signal receiver, comprising: a first member of insulating material having a hollow interior, a closed end and an open end, the inner periphery of said first member being larger than the outer periphery of the electrical member to be held therein; a second member of insulating material having a hollow interior, a closed end and an open end, the inner periphery of said second member being enlarged relative to the outer periphery of the first member to permit telescoping of the open end of said second member over the open end of said first member to form an enclosed capsule; a lead wire channel in the second member axially spaced from, and generally parallel to, said hollow interior; clip means in the closed end of said first and second members for electrically engaging and holding an electrical element in said enclosed capsule, each clip having lead wires connected thereto and extending exteriorly of the capsule; and mounting means on one of said members for securing said capsule to the chassis of a wave signal receiver and thereby mount said element to said chassis.

2. The capsule of claim 1 wherein the second member enlarged interior portion terminates in a second reduced interior portion of a lesser diameter than said second member enlarged interior portion, said second reduced interior diameter generally corresponding to the diameter of the hollow interior of the first member to limit telescopment of said first and second members.

3. The capsule of claim 2 wherein the second member second reduced interior portion terminates in a third reduced interior portion in which one of said clip means is mounted, said third reduced interior portion being of a lesser diameter than said second reduced interior portion and approximately the same diameter as the exterior dimension of a portion of said clip means to snugly receive the clip means.

4. The capsule of claim 3 wherein said first member hollow interior portion terminates in a reduced interior portion in which said clip means is mounted, said first member reduced interior portion being of a diameter which generally corresponds to the exterior dimension of a portion of said clip means to snugly receive the clip means.

References Cited

UNITED STATES PATENTS

| | | | |
|---|---|---|---|
| 1,254,886 | 1/1918 | Conrad | 338—325 X |
| 1,901,894 | 3/1933 | Burke | 200—127 |
| 2,423,021 | 6/1947 | Henckler et al. | 338—274 X |

FOREIGN PATENTS

| | | |
|---|---|---|
| 103,703 | 4/1938 | Austria. |

RICHARD M. WOOD, *Primary Examiner.*

J. G. SMITH, *Assistant Examiner.*